United States Patent [19]

Nishimura et al.

[11] Patent Number: 4,851,752
[45] Date of Patent: Jul. 25, 1989

[54] MAGNETIC ENCODER AND A METHOD FOR PRODUCING THE SAME

[75] Inventors: Seiya Nishimura; Mitsuo Yamaguchi; Kenzaburou Iijima, all of Hamamatsu, Japan

[73] Assignee: Yamaha Corporation, Japan

[21] Appl. No.: 168,160

[22] Filed: Mar. 15, 1988

[30] Foreign Application Priority Data

Mar. 26, 1987 [JP] Japan ............................. 62-72618
Mar. 26, 1987 [JP] Japan ............................. 62-72619

[51] Int. Cl.⁴ .......................................... H02K 11/00
[52] U.S. Cl. .................................. 318/602; 318/653; 310/68 B; 310/DIG. 6; 388/800
[58] Field of Search ............... 318/602, 603, 605, 618, 318/138, 254, 439, 653, 654, 552, 658, 659, 660, 661; 310/68 B, 84, 87, 128, 156, 231, 233, 235, 238, 239, 261, 262, 263, 265, 270, DIG. 3, DIG. 6, 800

[56] References Cited

U.S. PATENT DOCUMENTS

| | | | |
|---|---|---|---|
| 4,082,968 | 4/1978 | Jones | 318/326 X |
| 4,443,724 | 4/1984 | Handykken | 310/68 B X |
| 4,521,706 | 6/1985 | Kudelski et al. | 310/68 B X |
| 4,728,834 | 3/1988 | Kumar et al. | 310/DIG. 6 X |
| 4,729,160 | 3/1988 | Brown | 310/271 X |
| 4,734,603 | 3/1988 | Heide et al. | 310/68 B X |
| 4,758,769 | 7/1988 | Carrigan et al. | 318/326 X |
| 4,795,925 | 1/1989 | Mihara et al. | 310/68 B |
| 4,806,808 | 2/1989 | Grecksch et al. | 310/DIG. 6 X |
| 4,810,917 | 3/1989 | Kumar et al. | 310/DIG. 6 X |

Primary Examiner—William M. Shoop, Jr.
Assistant Examiner—Paul Ip
Attorney, Agent, or Firm—Lerner, David, Littenberg, Krumbolz & Mentlik

[57] ABSTRACT

In construction of a peripheral-magnetization type magnetic encoder having a rotary spindle and a magnetic head, a resin housing is formed by insert moulding so as to embrace the spindle leaving a slight tubular clearance to allow free axial rotation of the spindle, thereby providing direct, simple and stable support to the rotary spindle for enhanced precision in direction.

6 Claims, 5 Drawing Sheets

MAGNETIC ENCODER AND A METHOD FOR PRODUCING THE SAME

BACKGROUND OF THE INVENTION

The present invention relates to an improved magnetic encoder and a method for producing the same, and more particularly relates to production of a peripheral-magnetization type magnetic encoder adapted for detection of angular displacement, linear displacement and displacement speed of a mobile body in a control system for robots and NC equipments.

A peripheral-magnetization type magnetic encoder in general includes a rotary spindle coupled to a control system. The rotary spindle is mounted to a housing via bearings partly projecting outwards. A magnetic recording medium is coaxially mounted to the projecting section of the rotary spindle and a magnetized pattern is formed on the periphery of the magnetic recording medium. A magnetic detection head is arranged whilst facing the magnetized pattern on the magnetic recording medium with a prescribed clearance.

As the recording medium rotates with the rotary spindle, magnetic field applied to the detection head changes depending upon the magnetized pattern on the recording medium and, in response to such change in the magnetic field, the detection head generates a series of output signals representative of the magnetized pattern on the recording speed for detection of angular displacement, linear displacement or displacement speed of a mobile object in the control system connected to the rotary spindle.

For correct detection of the displacement or displacement speed, the clearance between the detection head and the magnetized pattern on the recording medium has to be maintained as constant as possible during rotation of the recording medium. In practice, however, the clearance inevitably fluctuate due to production errors of the rotary spindle and the recording medium, coupling error between the spindle and the recording medium and/or production error of the bearings interposed between the rotary spindle and the housing. All these troubles are believed to be caused by the above-described double mounting system in which the magnetic recording medium is mounted to the housing via the rotary spindle and the rotary spindle is mounted to the housing via the bearings.

SUMMARY OF THE INVENTION

It is the basic object of the present invention to keep the clearance between the magnetic detection head and the magnetized pattern on a peripheral-magnetization type magnetic encoder as constant as possible, thereby enhancing precision in detection by the encoder.

It is another object of the present invention to provide a simple method for producing such a peripheral-magnetization type encoder of high precision in detection.

In accordance with the first aspect of the present invention, a magnetic encoder includes a rotary spindle carrying a peripheral magnetized pattern and coupled to a given outer control system, a moulded resin housing embraces the spindle for axial rotation and carries a magnetic detection head spacedly facing the magnetized pattern, and a print board carrying circuit elements is attached to the housing.

In accordance with the second aspect of the present invention, the above-described housing is formed by insert moulding before attachment of the circuit elements.

DESCRIPTION OF THE PREFERRED EMBODIMENTS

Figure 1:
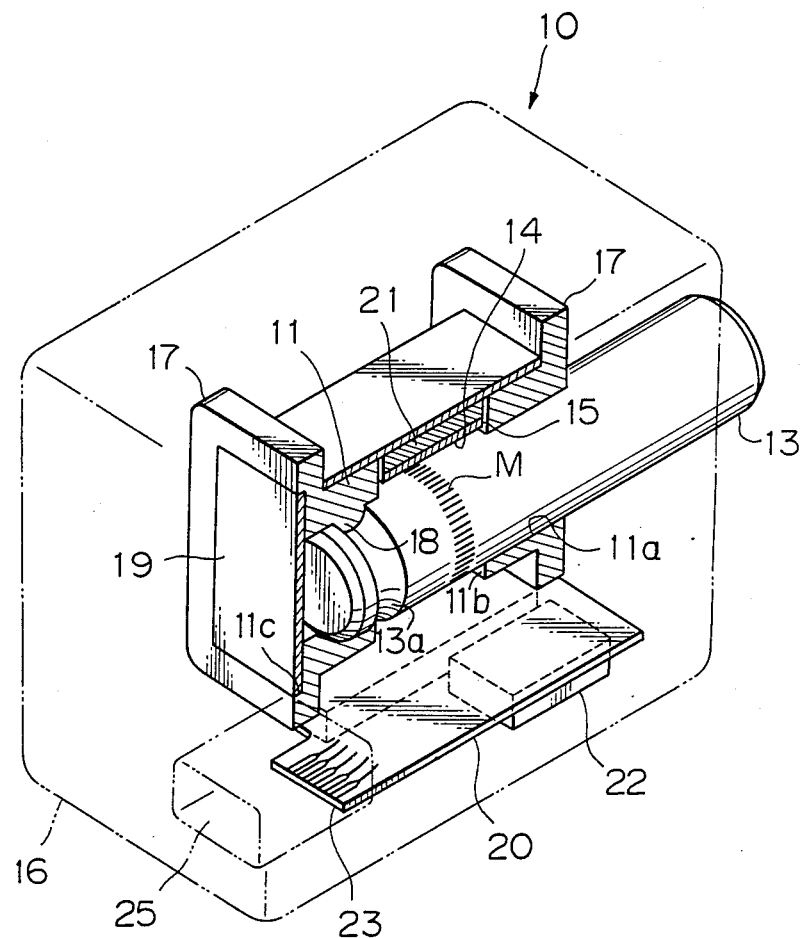
FIG. 1 is a perspective view, partly removed for easier understanding, of one embodiment of the magnetic encoder in accordance with the present invention.
Figure 2:
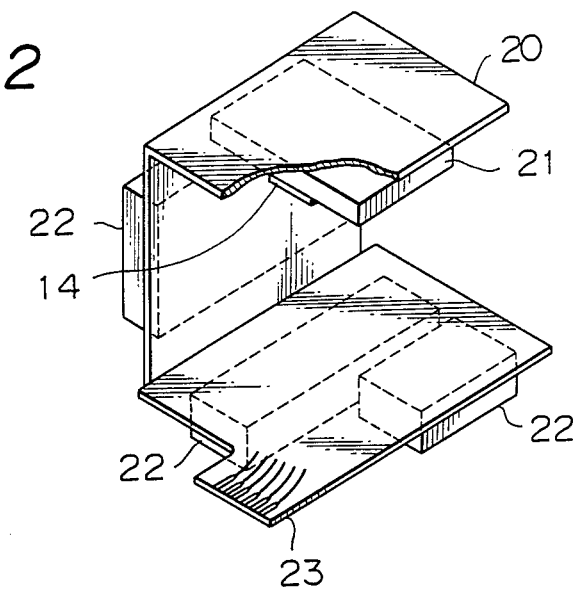
FIG. 2 is a perspective view, partly removed, of a part of the magnetic encoder shown in FIG. 1.

One embodiment of the magnetic encoder in accordance with the present invention is shown in FIGS. 1 and 2, in which the magnetic encoder 10 includes an inner housing 11 and a rotary spindle 13 rotatably held in the inner housing 11. A magnetized pattern M is formed on the periphery of the rotary spindle 13 and a magnetic detection head 14 is mounted to the inner housing 11 facing the magnetized pattern M on the rotary spindle 13 with a prescribed clearance. The detection head 14 is arranged in a window 15 formed in the inner housing 11. The inner housing 11, the rotary spindle 13 and the detection head 14 are encased in an outer housing 16 shown with chain lines. As later described in more detail, the inner housing 11 is formed by means of insert moulding.

More specifically, the rotary spindle 13 is made of Fe-Cr-Co alaloy or Fe-Co-Mn alloy which has high workability and high magnetic properties. Near one end of the rotary spindle 13, is formed an annular recess 13a of, preferably, a semicircular transverse cross-sectional profile for engagement with an annular projection 18 formed on the inner wall of the inner housing 11. Thanks to this engagement, the rotary spindle 13 is locked against axial displacement with respect to the inner housing 11. Near the annular recess 13a, is formed the magnetized pattern M on the periphery of the rotary spindle 13.

The inner housing 11 is given substantially in the form of a rectangular solid and provided, on both longitudinal ends, with a pair of rectangular flanges 17. Further, the inner housing 11 is provided with an axial through hole 11a whose inner diameter is roughly equal to the outer diameter of the rotary spindle 13. A transversal through hole 11b is also formed in the inner housing 11 across the axial through hole 11a. On one side of the axial through hole 11a, the transversal through hole 11b provides the above-described window 15 for the detection head 14.

A rectangular window 11c is formed in the end face of one of the flanges 17 near the magnetized pattern M in communication with the axial through hole 11a and a plate 19 is fitted into the window 11c to close the associated end of the axial through hole 11a.

Three sides of the inner housing 11 are embraced by an angled flexible print board or printed circuit board 20 such as shown in FIG. 2.

More specifically, the print board 20 is made up of a pair of opposed parallel sections and a connecting section intervening the parallel sections. The parallel sections close the associated ends of the transversal through holes 11b in the inner housing 11. The parallel section on the side of the window 15 is provided with the above-described magnetic detection head 14 attached thereto via a glass substrate 21. The three sections are provided with various circuit elements 22. These circuit elements 22 are electrically interconnected to each other by a circuit pattern marked on the print board 20, and further connected to outside devices (not shown) via a terminal 23 formed on one corner of the print board 20.

As later described in more detail, the outer housing 16 is formed around the inner casing 11, the rotary spindle 13, the plate 19 and the print board 20 by means of injection moulding and is provided with a hole 25 for exposure of the terminal 23 of the print board 20. The projecting section of the rotary spindle 13 is properly connected to the associated control system.

A slight tubular clearance is left between the inner housing 11 and the rotary spindle 13 to allow free rotation of the latter.

With the above-described construction of the magnetic encoder, fluctuation in clearance between the detection head 14 and the magnetized pattern M on the rotary spindle 13 is caused by production error of the rotary spindle 13 only. Only strict control in machining of the rotary spindle 13 is required to maintain the clearance constant and such control in machining can be done quite easily with the current technical level of the machining industry. In addition, the rotary spindle 13 carrying the magnetized pattern M and the detection head 14 are both directly supported by a common element, i.e. the inner housing 11. As a consequence, the clearance can be set very easily and exactly and, once set, there is no factor to cause any change in the clearance at all. Direct support of the rotary spindle 13 by the inner housing 11 much simplifies the construction with reduced parts.

Figure 3:
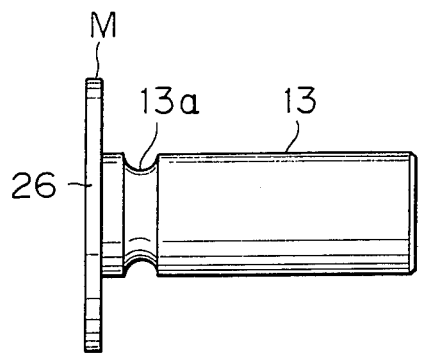
FIG. 3 is a side view of the rotary spindle used for another embodiment of the magnetic encoder in accordance with the present invention.

A modified embodiment of the magnetic encoder in accordance with the present invention is shown in FIG. 3, in which a coaxial disc 26 is formed in one body on one end of the rotary spindle 13 near the annular recess 13a and the magnetized pattern M is formed on the periphery of the disc 26. Since such a disc 26 can be formed by applying machining to the end of the rotary spindle 13 under rotation, this magnetic encoder also assures a constant clearance between the magnetized pattern M and the detection head.

Figure 4:
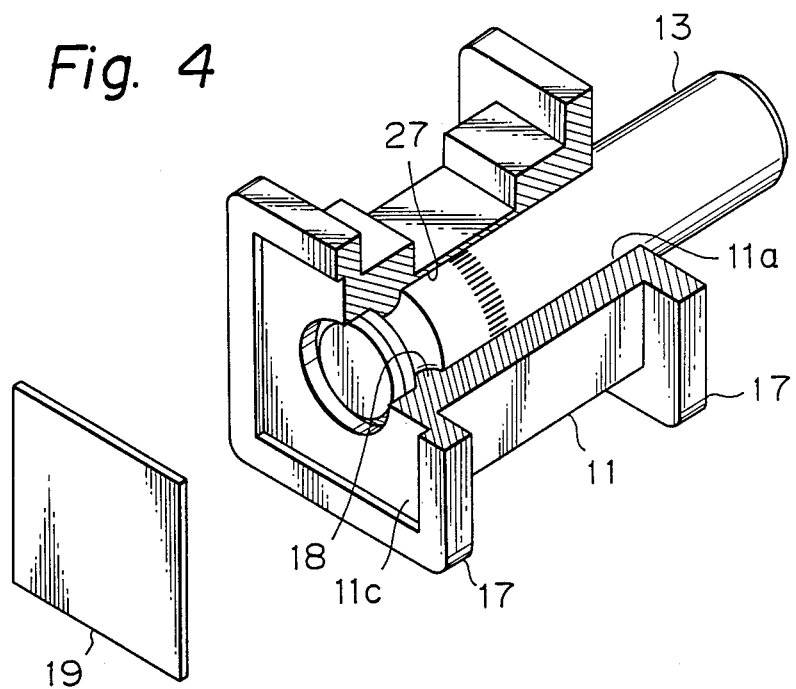
FIG. 4 is a perspective view, partly removed, of the other embodiment of the magnetic encoder in accordance with the present invention.
Figure 5:
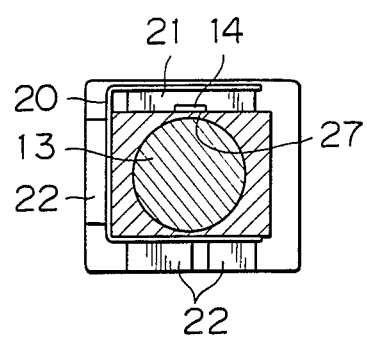

A further modified embodiment of the magnetic encoder in accordance with the present invention is shown in FIGS. 4 and 5. The inner housing 11 of this embodiment is provided with no transversal through hole providing the window 15 for the magnetic detection head 14. As a substitute, a thin section 27 is formed at a section of the inner housing 11 facing the magnetized pattern M on the rotary spindle 13 and the detection head 14 is arranged on the outer face of the thin section 27. Absence of the transversal through hole well prevents invasion of outside dusts which otherwise wield ill influence on magnetic detection.

One embodiment of the method in accordance with the present invention is shown in FIGS. 6 to 10, in which the magnetic encoder shown in FIG. 1 is produced.

In the first place, a tubular material is machined to obtain the spindle 13 shown in FIG. 1 which has the annular recess 13a near one end.

Figure 6:
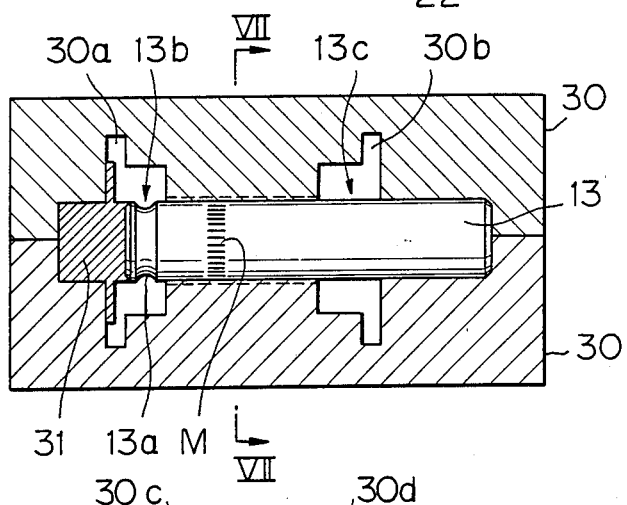
FIG. 6 is a transverse cross-sectional view of the magnetic encoder shown in FIG. 4, and FIGS. 6 to 11 are views for showing various operational steps in the production method in accordance with the present invention.
Figure 7:
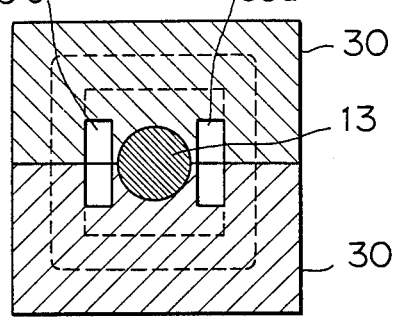
Figure 8:
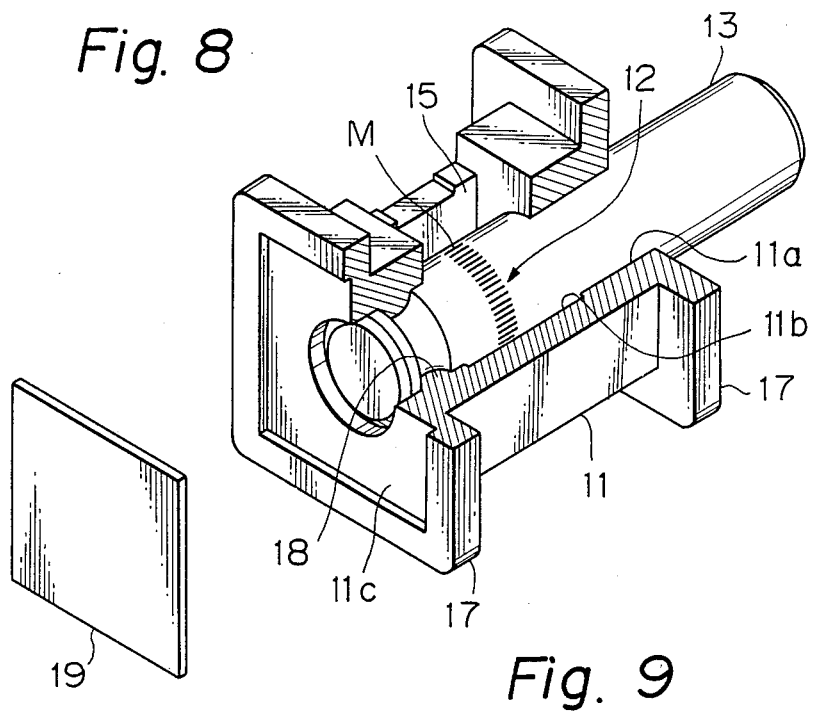

After cleaning, the magnetized pattern M is formed on the periphery of the spindle 13. Next, as shown in FIGS. 6 and 7, the spindle 13 is set in moulds 30 after local application of parting agent. More specifically, annular cavities 30a and 30b are provided in the moulds 30 surrounding the spindle 13 and a holder piece 31 is placed in one of the annular cavities 30a in contact with one end of the spindle 13 near the magnetized pattern M. Further, a pair of opposite side cavities 30c and 30d are provided in the moulds 30 in communication with the annular cavities 30a and 30b. Then, resin is infused into the cavities 30a–30d in the moulds 30 to obtain a combination shown in FIG. 8. This combination includes the spindle 13 and the inner housing 11 embracing the spindle 13. As stated already, the inner housing includes the axial through hole 11a accommodating the spindle 13, the transversal through hole 11b providing the window 15, the end flanges 17 each having the rectangular window 11c and the annular projection 18 in engagement with the annular recess 13a in the periphery of the spindle 13.

Next, the parting agent on the surface of the spindle is thermally or chemically removed. By this removal of the parting agent, a slight tubular clearance is formed between the inner casing 11 and the spindle 13 along the entire length of the latter to allow free rotation of the spindle 13. In addition, engagement of the annular projection 18 on the inner housing 11 with the annular recess 13a in the rotary spindle 13 inhibits free axial displacement of the latter. The plates 19 are then fitted into the windows 11c in the flanges 17 and the print board 20 is coupled to the combination.

The window 15 in the inner housing 11 is closed by the glass substrate 21 so that the underlying magnetic detection head 14 should face the magnetized pattern M on the rotary spindle 13 with a prscribed clearance. The terminal 23 projects from the inner houisng 11.

Figure 9:
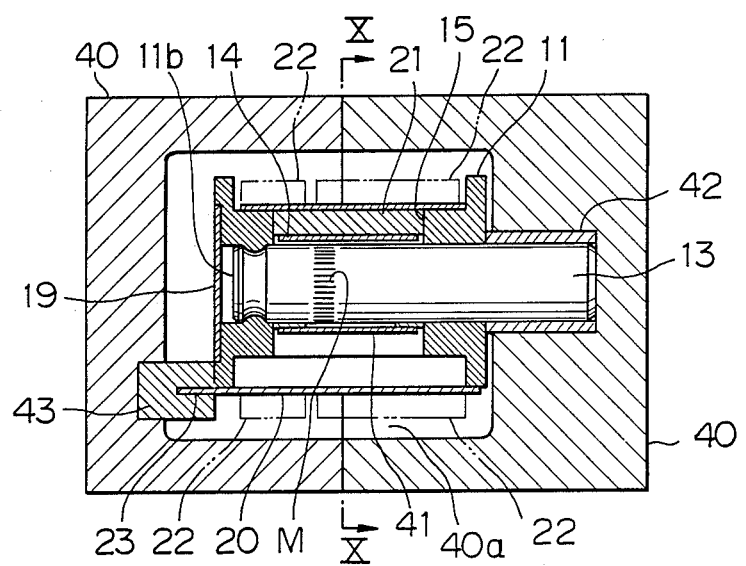
Figure 10:
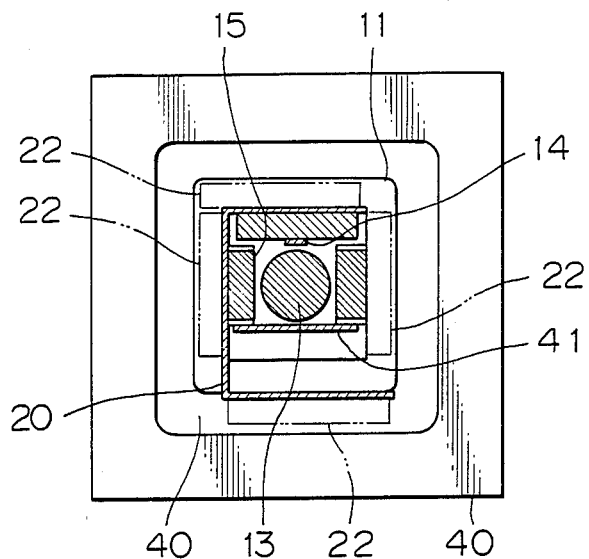

Next, as shown in FIGS. 9 and 10, the other end of the transversal through hole 11b is closed by a plate 41 and the circuit elements 22 are attached to the print board 20 to form an assembly. A tubular spacer 42 is inserted over the projecting section of the rotary spindle 13 and a holder piece 43 is inserted over the terminal 23 projecting from the inner housing 11. Next, the assembly is set in moulds 40 which defines a cavity 40a surrounding the assembly. Finally, resin is infused into the cavity 40a to form the outer housing 16 shows with chain lines in FIG. 1.

By removing the tubular spacer 42 and the holder piece 43 after demoulding, a slight clearance is left between the outer housing 16 and the rotary spindle 13 to allow free rotation of the latter and the hole 25 is left in the outer housing 16 to allow electric connection of the circuit elements 22 with outer devices.

Figure 11:
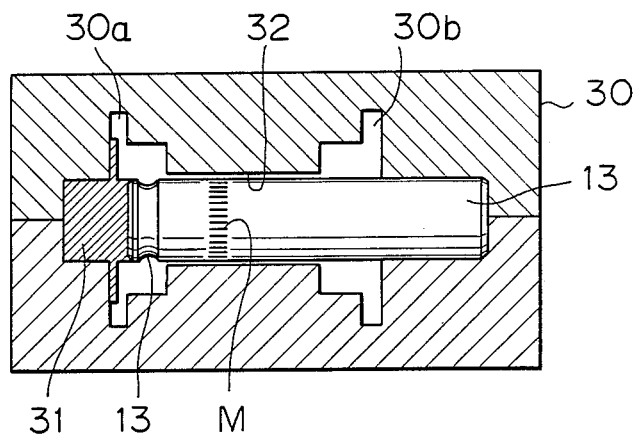

Another embodiment of the method in accordance with the present invention is shown in FIG. 11, in which the magnetic encoder shown in FIG. 4 is produced. In the case of this embodiment, a clearance 32 is provided in the moulds 30 in order to form the thin section 27 shown in FIG. 4.

Various modifications can be derived from the illustrated embodiments. For example, as the means for inhibiting axial displacement between the spindle 13 and the inner housing 11, an annular projection may be formed on the spindle 13 for engagement with a corresponding annular recess formed in the inner housing 11. As a substitute for such an annular engagement, a local engagement can be provided by a spot projection and a spot recess.

We claim:

1. An improved magnetic encoder comprising
   a spindle coupled to a given outer control system and provided with a peripheral annular magnetized pattern,
   a moulded resin housing embracing said spindle with a slight tubular clearance for allowing free axial rotation of said spindle,
   a magnetic detection head attached to said housing whilst facing said magnetized pattern on said spindle with a prescribed clearance, and
   a print board arranged embracing said housing and said magnetic detection head and provided with circuit elements and at least one connection terminal to outside devices.

2. An improved magnetic encoder as claimed in claim 1 in which
   said housing is provided with a window opening in an axial through hole accommodating said spindle, and
   said magnetic detection head is arranged in said window.

3. An improved magnetic encoder as claimed in claim 1 in which
   said housing is provided with a thin wall section at a position corresponding to said magnetized pattern on said spindle, and
   said magnetic detection head is attached to the outer face of said thin wall section.

4. An improved magnetic encoder as claimed in claim 1 further comprising
   means for inhibiting relative axial displacement between said spindle and said housing.

5. An improved magnetic encoder as claimed in claim 4 in which
   said inhibiting means includes at least one projection formed on one of said spindle and said housing and corresponding recess formed in the other of said spindle and said housing.

6. A method for producing a magnetic encoder comprising the steps of
   forming via moulding resin inner housing around a spindle having a peripheral magnetized pattern in a manner such that a slight tubular clearance should be left around said spindle to allow free axial rotation of the latter,
   attaching a print board with a magnetic detection head to said inner housing in a manner such that said magnetic detection head should face said magnetized pattern on said spindle with a prescribed clearance,
   attaching circuit elements and at least one connection terminal to the outer face of said print board to form an assembly, and
   forming via moulding a resin outer housing around said assembly.

* * * * *

UNITED STATES PATENT AND TRADEMARK OFFICE
CERTIFICATE OF CORRECTION

PATENT NO. : 4,851,752

DATED : July 25, 1989

INVENTOR(S) : Seiya Nishimura, et al.

It is certified that error appears in the above-identified patent and that said Letters Patent is hereby corrected as shown below:

Title page:

Abstract, line 7, "direction" should read -- detection --.

Column 2, line 16, "FIG. 6" should read -- FIG. 5 --.

Column 2, line 41, "alaloy" should read -- alloy --.

Column 4, line 41, "prscribed" should read -- prescribed --.

Column 4, line 42, "houisng" should read -- housing --.

Column 4, line 52, "shows" should read -- shown --.

Signed and Sealed this

Twenty-ninth Day of May, 1990

Attest:

HARRY F. MANBECK, JR.

*Attesting Officer*      *Commissioner of Patents and Trademarks*